US012122664B2

(12) United States Patent
Feng et al.

(10) Patent No.: US 12,122,664 B2
(45) Date of Patent: Oct. 22, 2024

(54) MICROFLUIDIC DEVICE AND PREPARATION METHOD THEREFOR, AND MICROFLUIDIC SYSTEM

(71) Applicants: INSTITUTE OF FLEXIBLE ELECTRONICS TECHNOLOGY OF THU, ZHEJIANG, Zhejiang (CN); Tsinghua University, Beijing (CN)

(72) Inventors: Xue Feng, Zhejiang (CN); Baicheng Zhang, Zhejiang (CN); Ying Chen, Zhejiang (CN); Haoran Fu, Zhejiang (CN); Ye Jiang, Zhejiang (CN); Lanlan Liu, Zhejiang (CN)

(73) Assignees: INSTITUTE OF FLEXIBLE ELECTRONICS TECHNOLOGY OF THU, ZHEJIANG, Jiaxing (CN); TSINGHUA UNIVERSITY, Beijing (CN)

( * ) Notice: Subject to any disclaimer, the term of this patent is extended or adjusted under 35 U.S.C. 154(b) by 1059 days.

(21) Appl. No.: 17/043,633

(22) PCT Filed: Dec. 7, 2018

(86) PCT No.: PCT/CN2018/119644
§ 371 (c)(1),
(2) Date: Sep. 29, 2020

(87) PCT Pub. No.: WO2020/010788
PCT Pub. Date: Jan. 6, 2020

(65) Prior Publication Data
US 2021/0053815 A1   Feb. 25, 2021

(30) Foreign Application Priority Data
Jul. 13, 2018 (CN) .......................... 201810771605.9

(51) Int. Cl.
B81B 1/00 (2006.01)
B81C 1/00 (2006.01)

(52) U.S. Cl.
CPC .......... B81B 1/006 (2013.01); B81C 1/00103 (2013.01)

(58) Field of Classification Search
CPC . B81B 1/006; B81C 1/00103; B81C 1/00119; B22C 3/00; B22C 9/06;
(Continued)

(56) References Cited

U.S. PATENT DOCUMENTS

2011/0045577 A1\* 2/2011 Bruzewicz ............. H05K 3/101
422/68.1
2013/0243655 A1\* 9/2013 Li ..................... B01L 3/502707
422/68.1

(Continued)

FOREIGN PATENT DOCUMENTS

CN    107570245      1/2018
CN    107570245 A  * 1/2018
(Continued)

OTHER PUBLICATIONS

EPO, Extended European Search Report for EP Application No. 18926354.4, Mar. 16, 2022.
WIPO, ISR for PCT/CN2018/119644, Apr. 16, 2019.

Primary Examiner — Jill A Warden
Assistant Examiner — John McGuirk
(74) Attorney, Agent, or Firm — Hodgson Russ LLP

(57) ABSTRACT

Provided are a method for preparing a microfluidic device, a microfluidic device and a microfluidic system. The method includes: providing a mold having a groove; injecting a liquid metal into the groove of the mold, and solidifying the liquid metal to obtain a solid metal; separating the solid metal from the mold; providing the solid metal with an electrode; providing a cladding layer on a surface of the
(Continued)

solid metal provided with the electrode, such that the solid metal is wrapped by the cladding layer, and at least a part of the electrode extends outside the cladding layer, so as to obtain a preform; and fixing the preform in a substrate, melting the solid metal and extending at least a part of the electrode outside the substrate, to obtain the microfluidic device.

19 Claims, 1 Drawing Sheet

(58) Field of Classification Search
CPC ......... B22C 9/061; B22C 9/22; B22D 21/007; B29C 39/34; B29C 33/52; B29C 33/485; B01L 3/502707; B01L 3/502715; B01L 2300/0816; B82Y 30/00; H05K 1/0283
See application file for complete search history.

(56) References Cited

U.S. PATENT DOCUMENTS

2017/0068027 A1* 3/2017 Powell .................... B29C 41/20
2017/0218167 A1* 8/2017 Majidi .................... C08K 3/08

FOREIGN PATENT DOCUMENTS

| CN | 107830893 | | 3/2018 |
| KR | 101583605 | | 1/2016 |
| KR | 101583605 | B1 * | 1/2016 |

* cited by examiner

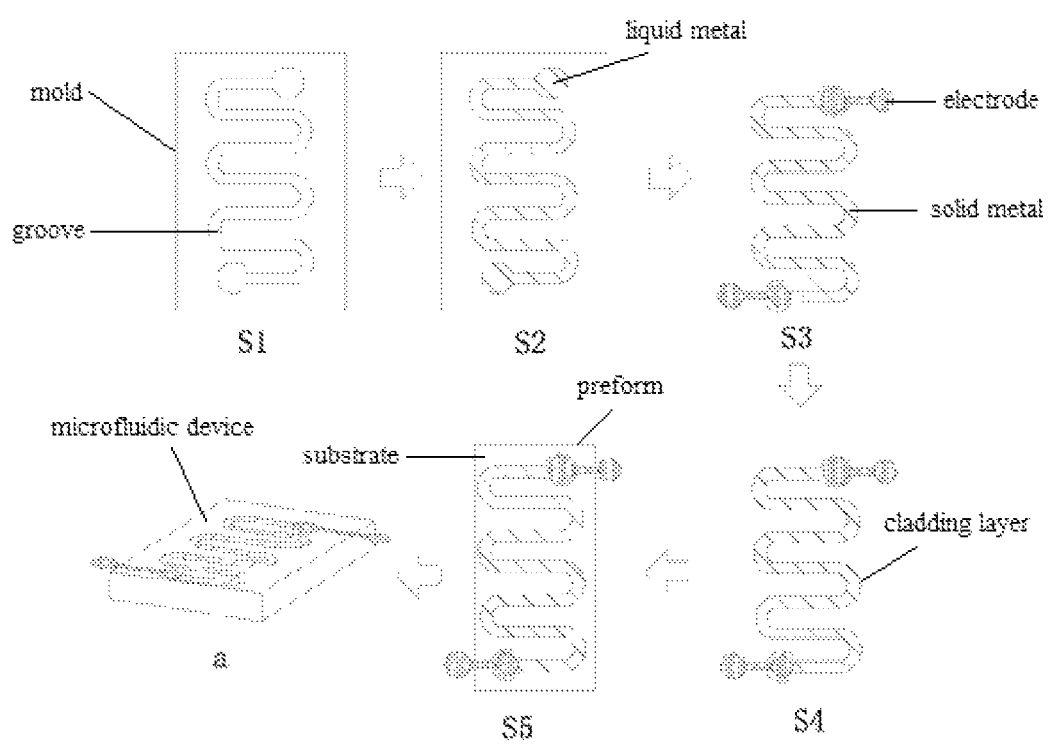

MICROFLUIDIC DEVICE AND PREPARATION METHOD THEREFOR, AND MICROFLUIDIC SYSTEM

CROSS-REFERENCE TO RELATED APPLICATION

This application is a U.S. National Phase entry of International Application No. PCT/CN2018/119644, filed Dec. 7, 2018, which claims priority to Chinese Patent Application Serial No. 201810771605.9, filed Jul. 13, 2018, the entire disclosures of which are incorporated herein by reference.

FIELD

The present disclosure relates to the field of microfluidic technologies, and more particularly to a microfluidic device and preparation method therefor, and a microfluidic system.

BACKGROUND

Traditional preparation methods of microfluidic devices mainly include 3D direct writing/printing technology, microchannel injection technology, imprinting technology and laser processing technology. However, 3D direct writing/printing technology cannot block water and oxygen better and achieve good packaging, and it is easy to form a metal oxide layer on the surface: the microchannel injection process is complex, and there are many restrictions on patterning and channel configuration: devices obtained by the imprinting technology are poor in integrated molding; and the laser processing technology has a complicated procedure and poor processing adaptability. Therefore, the traditional preparation methods of microfluidic devices each have their own shortcomings and deficiencies, which cannot adapt to the large-scale industrial production of microfluidic devices.

SUMMARY

In view of this, it is necessary to provide a microfluidic device and preparation method therefor and a microfluidic system for industrialization of the microfluidic device, in which the preparation method is simple and easy to industrialize, and has good encapsulation and high device integration, the microfluidic device obtained thereby has good formability, excellent performances and wide application fields, and is able to integrate with a power supply, a signal transmitter and a signal receiver to form the microfluidic system.

According to a first aspect of embodiments of the present disclosure, there is provided a method for preparing a microfluidic device. The method includes: providing a mold having a groove: injecting a liquid metal into the groove of the mold, and solidifying the liquid metal to obtain a solid metal: separating the solid metal from the mold: providing the solid metal with an electrode: providing a cladding layer on a surface of the solid metal provided with the electrode, such that the solid metal is wrapped by the cladding layer, and at least a part of the electrode extends outside the cladding layer, so as to obtain a preform; and fixing the preform in a substrate, melting the solid metal and extending at least a part of the electrode outside the substrate, to obtain the microfluidic device.

In an embodiment of the present disclosure, fixing the preform in a substrate includes: putting the preform in a substrate solution and curing the substrate solution, and melting the solid metal in the preform during the curing of the substrate solution, to obtain the microfluidic device.

In an embodiment of the present disclosure, the substrate solution includes one of a polymer, or a metal or metal alloy having a melting point below 300° C.

In an embodiment of the present disclosure, the polymer includes polydimethylsiloxane.

In an embodiment of the present disclosure, the liquid metal includes a gallium alloy.

In an embodiment of the present disclosure, injecting the liquid metal into the groove of the mold and solidifying the liquid metal are performed under an inert atmosphere.

In an embodiment of the present disclosure, a material for the electrode includes a silver nanowire, and the electrode has a conductivity greater than that of the liquid metal.

In an embodiment of the present disclosure, a material for the cladding layer includes a photocurable adhesive.

In an embodiment of the present disclosure, the photocurable adhesive has a melting point greater than or equal to 200° C.

In an embodiment of the present disclosure, the method further includes coating a lubricant on a surface of the groove before injecting the liquid metal into the groove.

According to a second aspect of embodiments of the present disclosure, there is provided a microfluidic device prepared by the method as described in any embodiment above. The microfluidic device includes: a substrate formed integrally: a cladding layer, disposed inside the substrate: a liquid metal, wrapped by the cladding layer; and an electrode, a part of the electrode being in contact with the liquid metal, and another part of the electrode extending outside the substrate.

According to a third aspect of embodiments of the present disclosure, there is provided a microfluidic system, which includes the microfluidic device as described in any embodiment above.

BRIEF DESCRIPTION OF THE DRAWINGS

FIG. 1 is a flowchart of a method for preparing a microfluidic device according to embodiments of the present disclosure, in which a represents the microfluidic device.

DETAILED DESCRIPTION

In the following, a microfluidic device and preparation method therefor as well as a microfluidic system provided according to embodiments of the present disclosure will be further illustrated.

As illustrated in FIG. 1, a method for preparing a microfluidic device according to embodiments of the present disclosure includes:

S1, providing a shaping mold having a groove:

S2, injecting a liquid metal into the groove of the mold, and solidifying the liquid metal to obtain a solid metal:

S3, separating the solid metal from the mold, and providing the solid metal with an electrode: S4, providing a cladding layer on a surface of the solid metal provided with the electrode, such that the solid metal is wrapped by the cladding layer, and at least a part of the electrode extends outside the cladding layer, so as to obtain a preform; and S5, fixing the preform in a substrate, and extending at least a part of the electrode outside the substrate, to obtain the microfluidic device a, which includes the liquid metal obtained after the melting of the solid metal.

At S1, the groove of the mold is configured to fill the liquid metal and solidify the liquid metal to a specific shape.

Considering that the solidified metal will stick to the groove and is not easy to peel off, it is preferred that the groove is coated with a lubricant on a surface thereof before injecting the liquid metal into the groove. The lubricant preferably is a compound not containing oxygen or sulfur atoms, such as vaseline or paraffin, which is in a colloidal state at low temperature and does not react with the liquid metal, so as to facilitate the separation of the liquid metal from the shaping mold after solidification. Further, after separation, the mold may be reused, thereby reducing the preparation cost and making the method suitable for industrialization.

A material for the mold includes a rigid material or a flexible material. The rigid material includes steel, copper, silicon and the like, and the flexible material includes polydimethylsiloxane (PDMS), polyethylene terephthalate (PET), polyimide (PI) and other polymer materials. The groove may be obtained by incising on a certain plane of a three-dimensional (3D) material or may be formed by splicing two or more 3D modules. Therefore, any complex structure of 3D configuration may be realized by the present disclosure. In an embodiment, a hollow structure may be formed by a tiny stent, and then the hollow structure is filled with a liquid metal having fluidity. Preferably, the groove includes at least one electrode-end groove and at least one channel groove, which may be increased and adjusted correspondingly according to different devices to be prepared.

At S2, a material for the liquid metal is not limited, including mercury or gallium alloy and the like. After the solidification of the liquid metal, the solid metal is obtained, which is the solidified form of the liquid metal.

Considering that the gallium alloy has a low melting point and is non-toxic, the liquid metal is preferably the gallium alloy: The gallium alloy is preferably one of Galinstan alloy (gallium-indium-tin alloy) or EGaIn alloy (eutectic indium-gallium alloy). The Galinstan alloy is mainly composed of three elements: Ga, In and Sn, and the melting point of the Galinstan alloy may be adjusted by adjusting the proportion of these elements. For example, when the proportion is 68.5 wt % Ga. 21.5 wt % In, and 10 wt % Sn, the melting point of the Galinstan alloy is $-19°$ C. When the proportion is 62.5 wt % Ga. 25 wt % In, and 12.5 wt % Sn, the melting point of the Galinstan alloy is $10°$ C. Therefore, the Gallium alloy may be used in thermometers, coolants and micro-electro-mechanical system (MEMS) devices instead of mercury. The EGaIn alloy is a eutectic alloy which is mainly composed of Ga and In, generally in a proportion of 75.5 wt % Ga and 24.5 wt % In, and has a melting point of $15.5°$ C. Certainly, the EGaIn alloy may be doped with other metals to increase its melting point to $58.3°$ C. and be used in electronic devices and circuits. Further, the viscosity and resistance of the liquid metal may be adjusted by doping a small amount of gallium oxide, so as to effectively reduce the surface tension.

However, the liquid metal is easy to be oxidized in the air. Therefore, when the liquid metal is used in the present disclosure, the packaging process is of great importance to realize the function and effect of the liquid metal. Preferably, the liquid metal may be poured into or injected through a syringe into the groove of the mold. Further, in order to better block water and oxygen, the liquid metal is injected into the groove of the mold and solidified under an inert atmosphere, such as in a glove box, to obtain the solid metal.

The method for solidifying the liquid metal is not limited. The liquid metal may be solidified by environmental temperature drop or by refrigeration equipment to accelerate physical cooling. In the present disclosure, it is preferred that contact refrigeration equipment is applied around or at a bottom of the shaping mold to provide a temperature lower than a solidification temperature of the liquid metal. After solidification, the surface activity of the solid metal is reduced, so the solid metal is not easy to react with water and oxygen in the air, which reduces the formation rate of an oxide on the surface of the solid metal.

After the liquid metal is solidified into the solid metal, it is less likely to deform and break. Moreover, the liquid metal will shrink during the solidification process, so after solidification, a volume of the solid metal is smaller as compared with that of the liquid metal, and a space is formed between the solid metal and the groove of the shaping mold. In addition, the surface of the groove is coated with the lubricant, so the liquid metal will not stick to the surface of the groove after solidification. Therefore, the solid metal can be separated from the shaping mold through the step S3. After separation, the solid metal is provided with the electrode to make it instrumented, thereby making it easy to integrate with other devices.

A material for the electrode is not limited, including metal conductive materials, metal oxide conductive materials, carbon-based conductive materials and the like. Preferably, the electrode has a conductivity greater than that of the liquid metal. Further, the conductivity of the electrode is two or more orders of magnitude greater than that of the liquid metal, and the material for the electrode is preferably a silver nanowire.

The preparation method of the electrode includes 3D printing, chemical vapor deposition (CVD), physical vapor deposition (PVD), sol-gel coating or transfer printing technologies, etc., and the conductivity of the electrode can be adjusted by the preparation method. Considering that the conductivity of the electrode is two or more orders of magnitude greater than that of the liquid metal, it is preferred to use 3D printing to prepare the electrode.

At S4, the cladding layer is provided on the surface of the solid metal provided with the electrode, which blocks water and oxygen better and prolongs the service life of the device. The cladding layer may be formed on the surface of the solid metal by immersion, spraying and the like. and a thickness of the cladding layer may be determined according to the adhesion of a cladding layer material to the surface of the solid metal and the blocking effect of the cladding layer material to water and oxygen. Preferably, under the premise that the better water and oxygen blocking effects are achieved, the thinner the cladding layer, the smaller the influence on the deformability of the microfluidic device.

The material for the cladding layer includes a photocurable adhesive, so the solid metal will not be affected during the photocuring process, i.e., the solid metal will not be oxidized during the photocuring process. Considering that the curing process of a substrate solution is an exothermic process, it is preferable that a melting point of the photocurable adhesive is greater than or equal to $200°$ C. to ensure that the cladding layer will not be melted during the curing process of the substrate solution. Preferably, the photocurable adhesive includes a UV curable adhesive.

At S5, the preform is put in the substrate solution and the substrate solution is cured, so based on the shape of a container, the substrate with a corresponding shape may be obtained by curing the substrate solution. Therefore, by setting the shape of the container in advance, the substrate covered on the surface of the cladding layer may be formed integrally, rather than spliced, so that the overall formability of the microfluidic device is good.

Moreover, the curing process of the substrate solution is an exothermic process, while the melting point of the solid metal is very low, so the heat released during the curing of the substrate solution is able to re-melt the solid metal to the liquid metal, so as to obtain the microfluidic device. In this process, the cladding layer not only blocks water and oxygen, but also shapes the liquid metal.

Preferably, the substrate solution includes one of a polymer, or a metal or metal alloy having a melting point below 300° C.

The polymer is not limited, and includes polyethylene, polypropylene, polystyrene, polyethylene terephthalate, polyimide, polyethylene naphthalate, polydimethylsiloxane, etc. Using the polymer as the substrate material enables the microfluidic device obtained after the curing of the substrate material to have flexibility and excellent tensile properties. Given that polydimethylsiloxane (PDMS) has strong elastic deformation ability, and its tensile properties may be easily adjusted, the polymer preferably is polydimethylsiloxane.

If the metal or metal alloy has an over-high melting point, their solutions will adversely affect the cladding layer. Therefore, the metal or metal alloy having a melting point below 300° C. are preferred. Among others, the metal having the melting point below 300° C. includes bismuth, cadmium, tin, lead, dysprosium, indium, etc., and the metal alloy having the melting points below 300° C. includes a bismuth alloy, a cadmium alloy, a tin alloy, a lead alloy, a dysprosium alloy, a indium alloy, etc. Using the metal or metal alloy with the melting point below 300° C. as the substrate material enables the microfluidic device obtained after the curing of the substrate material to have rigidity and excellent impact resistance.

The method according to embodiments of the present disclosure has the following beneficial effects. Firstly, the solid metal is prepared first using a shaping mold, and then encapsulated to block water and oxygen and shaped by the cladding layer, followed by being covered with the substrate, and then re-melted to the liquid metal using the heat released during the curing of the substrate. The method not only is simple, but also can obtain the integrated microfluidic device. Secondly, before covered with the substrate, the solid metal is encapsulated by the cladding layer to block water and oxygen, such that the solid metal will not be oxidized during melting, which increases the service life of the microfluidic device. Thirdly, by using the shaping mold, complex microfluidic devices with hollow or three-dimensional structures can be prepared by the method of the present disclosure, and the shaping mold can be used repeatedly, which make the method of the present disclosure suitable for industrial production.

Embodiments of the present disclosure further provide a microfluidic device obtained by the method as described in any embodiments above. The microfluidic device includes: a substrate formed integrally: a cladding layer, a liquid metal and an electrode. The cladding layer is disposed inside the substrate, the liquid metal is wrapped by the cladding layer, a part of the electrode is in contact with the liquid metal, and another part of the electrode extends outside the substrate.

The microfluidic device according to embodiments of the present disclosure has the following beneficial effects. Firstly, the microfluidic device is integrally formed with good formability, which breaks the restrictions of solid metal on metal shape and geometric design. Secondly, the microfluidic device has excellent performances, such as flexural and tensile properties as well as impact resistance, which are close to that of the substrate. Thirdly, the microfluidic device has good using effect and long service life, and stress accumulation and metal fatigue do not occur to the liquid metal even after long-term use of the microfluidic device.

Fourthly, the electrode of the microfluidic device may be directly connected to an external electrode, which is convenient to use and makes the application range of the microfluidic device wider.

Embodiments of the present disclosure further provide a microfluidic system, which includes the microfluidic device as described in any embodiment above.

By integrating the above microfluidic device of the present disclosure with a power supply, a signal receiver, a signal transmitter and the like, the microfluidic system may be formed, which may be applied to the fields of wearable equipment, circuits, communication equipment and the like with remarkable effects.

In the following, the microfluidic device and the preparation method therefor as well as the microfluidic system will be further illustrated with reference to the following examples.

Example 1

A snake-like shape was drawn for a liquid metal by CAD, and a groove with a corresponding snake-like shape was incised on a surface of a steel plate by a mold machine. Two mirror symmetric molds were prepared, and when the two molds were closed, a hollow structure was formed, which has two snake-like cylindrical channels with an electrode position. Vaseline, sealing grease, was coated on both a non-incised position and the surface of the groove to fill a gap exist between the two molds when they are closed, so as to seal the two molds more tightly.

The above molds were placed in a glove box filled with an inert gas, a Galinstan alloy including 62.5 wt % Ga, 25 wt % In and 12.5 wt % Sn was injected into the groove of the molds by a syringe at room temperature, and when the entire groove was filled with the Galinstan alloy, the injecting hole was sealed by vaseline.

The molds were placed at a low-temperature refrigerating part of refrigeration equipment for contact heat exchange. A refrigerating temperature of −10° C. was applied to accelerate the solidification of the Galinstan alloy, and after the surface temperature of the molds reached −10° C., the molds were kept at such a temperature for another 1 h to solidify the Galinstan alloy, obtaining a solid Galinstan alloy.

The two molds were opened from the position where the vaseline was coated, and the solid Galinstan alloy was taken out and placed on the refrigeration equipment having a temperature of −10° C. to keep the temperature of the solid Galinstan alloy below its melting point.

Silver nanowires were printed on a surface of a flexible material by 3D printing equipment, which were then directly adhered to the solid Galinstan alloy by transfer printing technology to complete the preparation of the electrode. Among others, the conductivity of the Galinstan alloy is $10^6$ S/m, and the conductivity of the silver nanowires is $10^8$ S/m.

A UV curable adhesive was sprayed onto a surface of the solid Galinstan alloy with a spraying thickness of 10 μm to ensure the effective coverage of the solid Galinstan alloy by the UV curable adhesive. By illuminated with the UV-light for 30 s, the UV curable adhesive was cured to form a cladding layer to wrap the solid Galinstan alloy, and a part of the silver nanowire electrode extended outside the cladding layer, obtaining a preform.

The preform was placed in a PDMS solution containing a PDMS prepolymer and a curing agent in a weight ratio of 10:1 and cured in an oven at 120° C. for 40 min. The solid Galinstan alloy was melted by the heat released during the curing of the PDMS solution, finally obtaining a microfluidic device.

The obtained microfluidic device includes the PDMS substrate, the UV cured adhesive cladding layer, the Galinstan alloy and the silver nanowire electrode, in which the UV cured adhesive cladding layer is disposed inside the PDMS substrate and has a closed channel, the Galinstan alloy is disposed in the closed channel, a part of the silver nanowire electrode is located in the closed channel and in contact with the Galinstan alloy, and another part of the silver nanowire electrode extends outside the PDMS substrate.

The testing result shows that the microfluidic device has a mechanical tensile performance of greater than 50% which remains after more than 4000 times of stretching, and a maximum bending angle of greater than 60° which remains after more than 1000 times of bending. The microfluidic device is able to integrate with a power supply, a signal receiver, a signal transmitter and the like to form a microfluidic system, which may be applied to the fields of wearable equipment, flexible circuits, communication equipment and the like.

Example 2

A snake-like shape was drawn for a liquid metal by CAD, and a groove with a corresponding snake-like shape was incised on a surface of a steel plate by a mold machine. Two mirror symmetric molds were prepared, and when the two molds were closed, a hollow structure was formed, which has two snake-like cylindrical channels with an electrode position. Vaseline, sealing grease, was coated on both a non-incised position and the surface of the groove to fill a gap exist between the two molds when they are closed, so as to seal the two molds more tightly.

The above molds were placed in a glove box filled with an inert gas, a Galinstan alloy including 62.5 wt % Ga, 25 wt % In and 12.5 wt % Sn was injected into the groove of the molds by a syringe at room temperature, and when the entire groove was filled with the Galinstan alloy, the injecting hole was sealed by vaseline.

The molds were placed at a low-temperature refrigerating part of refrigeration equipment for contact heat exchange. A refrigerating temperature of −10° C. was applied to accelerate the solidification of the Galinstan alloy, and after the surface temperature of the molds reached −10° C., the molds were kept at such a temperature for another 1 h to solidify the Galinstan alloy, obtaining a solid Galinstan alloy.

The two molds were opened from the position where the vaseline was coated, and the solid Galinstan alloy was taken out and placed on the refrigeration equipment having a temperature of −10° C. to keep the temperature of the solid Galinstan alloy below its melting point.

Silver nanowires were printed on a surface of a flexible material by 3D printing equipment, which were then directly adhered to the solid Galinstan alloy by transfer printing technology to complete the preparation of the electrode. Among others, the conductivity of the Galinstan alloy is $10^6$ S/m, and the conductivity of the silver nanowires is $10^8$ S/m.

A UV curable adhesive was sprayed onto a surface of the solid Galinstan alloy with a spraying thickness of 10 μm to ensure the effective coverage of the solid Galinstan alloy by the UV curable adhesive. By illuminated with the UV-light for 30 s, the UV curable adhesive was cured to form a cladding layer to wrap the solid Galinstan alloy, and a part of the silver nanowire electrode extended outside the cladding layer, obtaining a preform.

The preform was placed in a PDMS solution containing a PDMS prepolymer and a curing agent in a weight ratio of 10:1 and cured in an oven at 90° C. for 40 min. The solid Galinstan alloy was melted by the heat released during the curing of the PDMS solution, finally obtaining a microfluidic device.

The obtained microfluidic device includes the PDMS substrate, the UV cured adhesive cladding layer, the Galinstan alloy and the silver nanowire electrode, in which the UV cured adhesive cladding layer is disposed inside the PDMS substrate and has a closed channel, the Galinstan alloy is disposed in the closed channel, a part of the silver nanowire electrode is located in the closed channel and in contact with the Galinstan alloy, and another part of the silver nanowire electrode extends outside the PDMS substrate.

The testing result shows that the microfluidic device has a mechanical tensile performance of greater than 100% which remains after more than 5000 times of stretching, and a maximum bending angle of greater than 90° which remains after more than 2000 times of bending. The microfluidic device is able to integrate with a power supply, a signal receiver, a signal transmitter and the like to form a microfluidic system, which may be applied in intelligent medical, biomedical, human wearable equipment and other fields.

Example 3

A snake-like shape was drawn for a liquid metal by CAD, and a groove with a corresponding snake-like shape was incised on a surface of a steel plate by a mold machine. Two mirror symmetric molds were prepared, and when the two molds were closed, a hollow structure was formed, which has two snake-like cylindrical channels with an electrode position. Vaseline, sealing grease, was coated on both a non-incised position and the surface of the groove to fill a gap exist between the two molds when they are closed, so as to seal the two molds more tightly.

The above molds were placed in a glove box filled with an inert gas, a Galinstan alloy including 62.5 wt % Ga, 25 wt % In and 12.5 wt % Sn was injected into the groove of the molds by a syringe at room temperature, and when the entire groove was filled with the Galinstan alloy, the injecting hole was sealed by vaseline.

The molds were placed at a low-temperature refrigerating part of refrigeration equipment for contact heat exchange. A refrigerating temperature of −10° C. was applied to accelerate the solidification of the Galinstan alloy, and after the surface temperature of the molds reached −10° C., the molds were kept at such a temperature for another 1 h to solidify the Galinstan alloy, obtaining a solid Galinstan alloy.

The two molds were opened from the position where the vaseline was coated, and the solid Galinstan alloy was taken out and placed on the refrigeration equipment having a temperature of −10° C. to keep the temperature of the solid Galinstan alloy below its melting point.

Silver nanowires were printed on a surface of a flexible material by 3D printing equipment, which were then directly adhered to the solid Galinstan alloy by transfer printing technology to complete the preparation of the electrode. Among others, the conductivity of the Galinstan alloy is $10^6$ S/m, and the conductivity of the silver nanowires is $10^8$ S/m.

A UV curable adhesive was sprayed onto a surface of the solid Galinstan alloy with a spraying thickness of 10 μm to ensure the effective coverage of the solid Galinstan alloy by the UV curable adhesive. By illuminated with the UV-light for 30 s, the UV curable adhesive was cured to form a cladding layer to wrap the solid Galinstan alloy, and a part of the silver nanowire electrode extended outside the cladding layer, obtaining a preform.

The preform was placed in a PDMS solution containing a PDMS prepolymer and a curing agent in a weight ratio of 10:1 and cured in an oven at 60° C. for 40 min. The solid Galinstan alloy was melted by the heat released during the curing of the PDMS solution, finally obtaining a microfluidic device.

The obtained microfluidic device includes the PDMS substrate, the UV cured adhesive cladding layer, the Galinstan alloy and the silver nanowire electrode, in which the UV cured adhesive cladding layer is disposed inside the PDMS substrate and has a closed channel, the Galinstan alloy is disposed in the closed channel, a part of the silver nanowire electrode is located in the closed channel and in contact with the Galinstan alloy, and another part of the silver nanowire electrode extends outside the PDMS substrate.

The testing result shows that the microfluidic device has a mechanical tensile performance of greater than 200% which remains after more than 6000 times of stretching, and a maximum bending angle of greater than 120° which remains after more than 3000 times of bending. The microfluidic device is able to integrate with a power supply, a signal receiver, a signal transmitter and the like to form a microfluidic system, which may be applied in intelligent medical, biomedical, human wearable equipment and other fields.

Example 4

A circuit shape was drawn for a liquid metal by CAD, and a groove with a corresponding snake-like shape was incised on a PDMS solid block with a high elastic modulus by a mold machine. Two mirror symmetric molds were prepared, and when the two molds were closed, a hollow structure was formed, which was a cylindrical circuit channel with an electrode position. Vaseline, sealing grease, was coated on both a non-incised position and the surface of the groove to fill a gap exist between the two molds when they are closed, so as to seal the two molds more tightly.

The above molds were placed in a glove box filled with an inert gas, an EGaIn alloy including 75.5 wt % Ga and 24.5 wt % In and having a melting point of 15.5° C. was injected into the groove of the molds by a syringe at room temperature, and when the entire groove was filled with the EGaIn alloy; the injecting hole was sealed by vaseline.

The molds were placed at a low-temperature refrigerating part of refrigeration equipment for contact heat exchange. A refrigerating temperature of −15° C. was applied to accelerate the solidification of the EGaIn alloy, and after the surface temperature of the molds reached −15° C., the molds were kept at such a temperature for another 0.5 h to solidify the EGaIn alloy, obtaining a solid EGaIn alloy.

The two molds were opened from the position where the vaseline-sealed hole was located, and the solid EGaIn alloy was taken out and placed on the refrigeration equipment having a temperature of −15° C. to keep the temperature of the solid EGaIn alloy below its melting point.

Silver nanowires were printed on a surface of a flexible material by spraying equipment, which were then directly adhered to the solid EGaIn alloy by transfer printing technology to complete the preparation of the electrode. Among others, the conductivity of the EGaIn alloy is $10^4$ S/m, and the conductivity of the silver nanowires is $10^7$ S/m.

The solid EGaIn alloy was immersed in a UV curable adhesive and held for 60 s after removed from the UV curable adhesive to ensure the effective coverage of the solid EGaIn alloy by the UV curable adhesive. By illuminated with the UV-light for 60 s, the UV curable adhesive was cured to form a cladding layer to wrap the solid EGaIn alloy, and a part of the silver nanowire electrode extended outside the cladding layer, obtaining a preform.

The preform was placed in a PDMS solution containing a PDMS prepolymer and a curing agent in a weight ratio of 5:1 for 2 days at room temperature. The solid EGaIn alloy was melted by the heat released during the curing of the PDMS solution, finally obtaining a microfluidic device.

The obtained microfluidic device includes the PDMS substrate, the UV cured adhesive cladding layer, the EGaIn alloy and the silver nanowire electrode, in which the UV cured adhesive cladding layer is disposed inside the PDMS substrate and has a closed channel, the EGaIn alloy is disposed in the closed channel, a part of the silver nanowire electrode is located in the closed channel and in contact with the EGaIn alloy, and another part of the silver nanowire electrode extends outside the PDMS substrate.

The testing result shows that the microfluidic device has a mechanical tensile performance of greater than 400% which remains after more than 8000 times of stretching, and a maximum bending angle of greater than 150° which remains after more than 6000 times of bending. The microfluidic device is able to integrate with a power supply, a signal receiver, a signal transmitter and the like to form a microfluidic system, which may be applied in the skin-like electronic field and the like.

Example 5

A circuit shape was drawn for a liquid metal by CAD, and a groove with a corresponding snake-like shape was incised on a PDMS solid block with a high elastic modulus by a mold machine. Two mirror symmetric molds were prepared, and when the two molds were closed, a hollow structure was formed, which was a cylindrical circuit channel with an electrode position. Vaseline, sealing grease, was coated on both a non-incised position and the surface of the groove to fill a gap exist between the two molds when they are closed, so as to seal the two molds more tightly.

The above molds were placed in a glove box filled with an inert gas, a $Bi_{35}In_{48.6}Sn_{16}Zn_{0.4}$ liquid metal synthesized by bismuth, indium, tin and zinc in a weight ratio of 35:48.3: 16:0.4 and having a melting point of 58.3° C. was injected into the groove of the molds by a syringe at 60° C., and when the entire groove was filled with the $Bi_{35}In_{48.6}Sn_{16}Zn_{0.4}$ alloy, the injecting hole was sealed by vaseline.

The molds were placed at room temperature for contact heat exchange, and kept for 2 h after the temperature was stable to solidify the $Bi_{35}In_{48.6}Sn_{16}Zn_{0.4}$ alloy, obtaining a solid $Bi_{35}In_{48.6}Sn_{16}Zn_{0.4}$ alloy.

The two molds were opened from the position where the vaseline-sealed hole was located, and the solid $Bi_{35}In_{48.6}Sn_{16}Zn_{0.4}$ alloy was taken out and placed at room temperature to keep the temperature of the solid $Bi_{35}In_{48.6}Sn_{16}Zn_{0.4}$ alloy below its melting point.

Silver nanowires were printed on a surface of a flexible material by spraying equipment, which were then directly adhered to the solid $Bi_{35}In_{48.6}Sn_{16}Zn_{0.4}$ alloy by transfer printing technology to complete the preparation of the electrode. Among others, the conductivity of the $Bi_{35}In_{48.6}Sn_{16}Zn_{0.4}$ alloy is 105 S/m, and the conductivity of the silver nanowires is $10^8$ S/m.

The solid $Bi_{35}In_{48.6}Sn_{16}Zn_{0.4}$ alloy was immersed in a UV curable adhesive and held for 60 s after removed from the UV curable adhesive to ensure the effective coverage of the solid $Bi_{35}In_{48.6}Sn_{16}Zn_{0.4}$ alloy by the UV curable adhesive. By illuminated with the UV-light for 60 s, the UV curable adhesive was cured to form a cladding layer to wrap the solid $Bi_{35}In_{48.6}Sn_{16}Zn_{0.4}$ alloy, and a part of the silver nanowire electrode extended outside the cladding layer, obtaining a preform.

The preform was placed in a PDMS solution containing a PDMS prepolymer and a curing agent in a weight ratio of 5:1 at room temperature for curing. The heat released during the curing of the PDMS solution raised the temperature of the PDMS solution to above 80° C. and melted the solid $Bi_{35}In_{48.6}Sn_{16}Zn_{0.4}$ alloy, finally obtaining a microfluidic device.

The obtained microfluidic device includes the PDMS substrate, the UV cured adhesive cladding layer, the $Bi_{35}In_{48.6}Sn_{16}Zn_{0.4}$ alloy and the silver nanowire electrode, in which the UV cured adhesive cladding layer is disposed inside the PDMS substrate and has a closed channel, the $Bi_{35}In_{48.6}Sn_{16}Zn_{0.4}$ alloy is disposed in the closed channel, a part of the silver nanowire electrode is located in the closed channel and in contact with the $Bi_{35}In_{48.6}Sn_{16}Zn_{0.4}$ alloy, and another part of the silver nanowire electrode extends outside the PDMS substrate.

The testing result shows that the microfluidic device has a mechanical tensile performance of greater than 400% which remains after more than 8000 times of stretching, and a maximum bending angle of greater than 150° which remains after more than 6000 times of bending. The microfluidic device is able to integrate with a power supply, a signal receiver, a signal transmitter and the like to form a microfluidic system, which may be applied in special circuits and other fields.

Example 6

A circuit shape was drawn for a liquid metal by CAD, and a groove with a corresponding snake-like shape was incised on a steel plate by a mold machine. Two mirror symmetric molds were prepared, and when the two molds were closed, a hollow structure was formed, which was a cylindrical circuit channel with an electrode position. Silicone oil, sealing grease, was coated on both a non-incised position and the surface of the groove to fill a gap exist between the two molds when they are closed, so as to seal the two molds more tightly.

The above molds were placed in a glove box filled with an inert gas, a Galinstan alloy including 68.5 wt % Ga, 21.5 wt % In and 10 wt % Sn was injected into the groove of the molds by a syringe at room temperature, and when the entire groove was filled with the Galinstan alloy, the injecting hole was sealed by a metal flange.

The molds were placed at a low-temperature refrigerating part of refrigeration equipment for contact heat exchange. A refrigerating temperature of −30° C. was applied to accelerate the solidification of the Galinstan alloy, and after the surface temperature of the molds reached −30° C., the molds were kept at such a temperature for another 2 h to solidify the Galinstan alloy, obtaining a solid Galinstan alloy.

The two molds were opened from the position where the flange was located, and the solid Galinstan alloy was taken out and placed on the refrigeration equipment having a temperature of −30° C. to keep the temperature of the solid Galinstan alloy below its melting point.

Silver nanowires were printed on a surface of a flexible material by spraying equipment, which were then directly adhered to the solid Galinstan alloy by transfer printing technology to complete the preparation of the electrode. Among others, the conductivity of the Galinstan alloy is $10^4$ S/m, and the conductivity of the silver nanowires is $10^7$ S/m.

The solid Galinstan alloy was immersed in a UV curable adhesive and held for 30 s after removed from the UV curable adhesive to ensure the effective coverage of the solid Galinstan alloy by the UV curable adhesive. By illuminated with the UV-light for 60 s, the UV curable adhesive was cured to form a cladding layer to wrap the solid Galinstan alloy, and a part of the silver nanowire electrode extended outside the cladding layer, obtaining a preform.

The preform was placed in a PET solution containing a PET prepolymer and a curing agent in a weight ratio of 8:1 and cured in an oven at 110° C. for 60 min. The solid Galinstan alloy was melted by the heat released during the curing of the PET solution, finally obtaining a microfluidic device.

The obtained microfluidic device includes the PET substrate, the UV cured adhesive cladding layer, the Galinstan alloy and the silver nanowire electrode, in which the UV cured adhesive cladding layer is disposed inside the PET substrate and has a closed channel, the Galinstan alloy is disposed in the closed channel, a part of the silver nanowire electrode is located in the closed channel and in contact with the Galinstan alloy, and another part of the silver nanowire electrode extends outside the PET substrate.

The testing result shows that the microfluidic device has a mechanical tensile performance of greater than 50% which remains after more than 6000 times of stretching, and a maximum bending angle of greater than 60° which remains after more than 2000 times of bending. The microfluidic device is able to integrate with a power supply, a signal receiver, a signal transmitter and the like to form a microfluidic system, which may be applied in the skin-like electronic field and the like.

Example 7

A circuit shape was drawn for a liquid metal by CAD, and a groove with a corresponding snake-like shape was incised on a PDMS solid block with a high elastic modulus by a mold machine. Two mirror symmetric molds were prepared, and when the two molds were closed, a hollow structure was formed, which was a cylindrical circuit channel with an electrode position. Vaseline, sealing grease, was coated on both a non-incised position and the surface of the groove to fill a gap exist between the two molds when they are closed, so as to seal the two molds more tightly.

The above molds were placed in a glove box filled with an inert gas, an EGaIn alloy including 75.5 wt % Ga and 24.5 wt % In and having a melting point of 15.5° C. was injected into the groove of the molds by a syringe at room temperature, and when the entire groove was filled with the EGaIn alloy, the injecting hole was sealed by vaseline.

The molds were placed at a low-temperature refrigerating part of refrigeration equipment for contact heat exchange. A refrigerating temperature of −15° C. was applied to accelerate the solidification of the EGaIn alloy, and after the surface temperature of the molds reached −15° C., the molds were kept at such a temperature for another 0.5 h to solidify the EGaIn alloy, obtaining a solid EGaIn alloy.

The two molds were opened from the position where the vaseline-sealed hole was located, and the solid EGaIn alloy was taken out and placed on the refrigeration equipment having a temperature of −15° C. to keep the temperature of the solid EGaIn alloy below its melting point.

Silver nanowires were printed on a surface of a flexible material by spraying equipment, which were then directly adhered to the solid EGaIn alloy by transfer printing technology to complete the preparation of the electrode. Among others, the conductivity of the EGaIn alloy is $10^4$ S/m, and the conductivity of the silver nanowires is $10^7$ S/m.

The solid EGaIn alloy was immersed in a UV curable adhesive and held for 60 s after removed from the UV curable adhesive to ensure the effective coverage of the solid EGaIn alloy by the UV curable adhesive. By illuminated with the UV-light for 60 s, the UV curable adhesive was cured to form a cladding layer to wrap the solid EGaIn alloy, and a part of the silver nanowire electrode extended outside the cladding layer, obtaining a preform.

500 g of metallic tin was melted into a tin solution at 250° C., and heating was stopped after the preform was placed in the tin solution to cool the tin solution rapidly at room temperature. The high temperature of 250° C. was enough to melt the solid EGaIn alloy, finally obtaining a rigid microfluidic device.

The obtained microfluidic device includes the rigid tin substrate, the UV cured adhesive cladding layer, the EGaIn alloy and the silver nanowire electrode, in which the UV cured adhesive cladding layer is disposed inside the rigid tin substrate and has a closed channel, the EGaIn alloy is disposed in the closed channel, a part of the silver nanowire electrode is located in the closed channel and in contact with the EGaIn alloy, and another part of the silver nanowire electrode extends outside the rigid tin substrate.

The testing result shows that the microfluidic device has excellent impact resistance, corrosion resistance and toughness, and may be integrated with a power supply, a signal receiver, a signal transmitter and the like to form a microfluidic system, which may be applied in the field of solid state circuits.

It will be understood that, in order to make the description concise, only some explanatory embodiments are described herein, rather than all the possible combinations of the various technical features in the above-mentioned embodiments. However, it will be appreciated that various technical features of the above-mentioned embodiments can be combined arbitrarily, as long as they are not contradictory, which also should be considered as the scope of the present disclosure.

The explanatory examples described in detail above only express several embodiments of the present disclosure, which cannot be construed as a limitation to the scope of the present disclosure. It would be appreciated by those skilled in the art that several changes and improvements can be made without departing from the spirit of the present disclosure, which all belong to the protection scope of the present disclosure, and the protection scope of the present disclosure should be subject to the appended claims.

What is claimed is:

1. A method for preparing a microfluidic device, comprising:
   providing a mold having a microgroove;
   injecting a liquid metal into the microgroove of the mold, and solidifying the liquid metal to obtain a solid metal;
   separating the solid metal from the mold;
   attaching an electrode to the solid metal;
   providing a cladding layer on a surface of the solid metal provided with the electrode, such that the solid metal is wrapped by the cladding layer, and at least a part of the electrode extends outside the cladding layer, so as to obtain a preform; and
   fixing the preform in a substrate, melting the solid metal and extending at least a part of the electrode outside the substrate, to obtain the microfluidic device.

2. The method according to claim 1, wherein fixing the preform in a substrate comprises: putting the preform in a substrate solution and curing the substrate solution, and melting the solid metal in the preform during the curing of the substrate solution, to obtain the microfluidic device.

3. The method according to claim 2, wherein the substrate solution comprises one of a metal or metal alloy having a melting point below 300° C., or a polymer.

4. The method according to claim 3, wherein the polymer comprises polydimethylsiloxane.

5. The method according to claim 1, wherein the liquid metal comprises a gallium alloy.

6. The method according to claim 1, wherein injecting the liquid metal into the microgroove of the mold and solidifying the liquid metal are performed under an inert atmosphere.

7. The method according to claim 1, wherein a material for the electrode comprises a silver nanowire, and the electrode has a conductivity greater than that of the liquid metal.

8. The method according to claim 1, wherein a material for the cladding layer comprises a photocurable adhesive.

9. The method according to claim 8, wherein the photocurable adhesive has a melting point greater than or equal to 200° C.

10. The method according to claim 1, further comprising coating a lubricant on a surface of the microgroove before injecting the liquid metal into the microgroove.

11. The method according to claim 5, wherein the gallium alloy is selected from Galinstan alloy and EGaIn alloy.

12. The method according to claim 11, wherein the Galinstan alloy comprises 68.5 wt % Ga, 21.5 wt % In and 10 wt % Sn, and has a melting point of −19° C.; or
   the Galinstan alloy comprises 62.5 wt % Ga, 25 wt % In and 12.5 wt % Sn, and has a melting point of 10° C.

13. The method according to claim 11, wherein the EGaIn alloy comprises 75.5 wt % Ga and 24.5 wt % In, and has a melting point of 15.5° C.

14. The method according to claim 3, wherein the metal or metal alloy having the melting point below 300° C. is selected from bismuth, cadmium, tin, lead, dysprosium, indium, a bismuth alloy, a cadmium alloy, a tin alloy, a lead alloy, a dysprosium alloy and an indium alloy.

15. A microfluidic device, comprising:
   a substrate formed integrally;
   a cladding layer, disposed inside the substrate;
   a liquid metal, fully wrapped on its entire exterior by the cladding layer; and
   an electrode, a part of the electrode being in contact with the liquid metal, and another part of the electrode extending outside the substrate,
   wherein a material for the cladding layer comprises a photocurable adhesive.

16. A microfluidic system, comprising a microfluidic device according to claim 15.

17. The microfluidic device according to claim 11, wherein the substrate comprises one of a metal or metal alloy having a melting point below 300° C., or a polymer.

18. The microfluidic device according to claim 11, wherein the liquid metal comprises a gallium alloy selected from Galinstan alloy and EGaIn alloy.

19. The microfluidic device according to claim 11, wherein the liquid metal comprises at least one of:
- a Galinstan alloy comprising 68.5 wt % Ga, 21.5 wt % In and 10 wt % Sn, and having a melting point of −19° C.;
- a Galinstan alloy comprising 62.5 wt % Ga, 25 wt % In and 12.5 wt % Sn, and having a melting point of 10° C.; or
- an EGaIn alloy comprising 75.5 wt % Ga and 24.5 wt % In, and having a melting point of 15.5° C.

* * * * *